(12) United States Patent
Yamagami et al.

(10) Patent No.: US 8,067,776 B2
(45) Date of Patent: Nov. 29, 2011

(54) METHOD OF MANUFACTURING SEMICONDUCTOR DEVICE AND SEMICONDUCTOR DEVICE MANUFACTURED THEREOF

(75) Inventors: Shigeharu Yamagami, Yokohama (JP); Masakatsu Hoshi, Yokohama (JP); Tetsuya Hayashi, Yokosuka (JP); Hideaki Tanaka, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 375 days.

(21) Appl. No.: 12/105,318

(22) Filed: Apr. 18, 2008

(65) Prior Publication Data

US 2008/0303036 A1    Dec. 11, 2008

(30) Foreign Application Priority Data

Jun. 8, 2007  (JP) ................................. 2007-153006
Dec. 26, 2007  (JP) ................................. 2007-333626

(51) Int. Cl.
*H01L 29/12* (2006.01)
*H01L 29/76* (2006.01)
*H01L 29/78* (2006.01)
*H01L 21/28* (2006.01)
*H01L 21/336* (2006.01)

(52) U.S. Cl. .................. 257/77; 257/330; 257/E29.081; 257/E29.104; 257/E29.131; 257/E29.257; 257/E29.262; 257/E21.065; 257/E21.066; 257/E21.054

(58) Field of Classification Search .................. 438/287, 438/105, 268, 270; 257/77, 329, 330, E21.054, 257/E21.065, E21.066, E29.081, E29.104, 257/E29.131, E29.257, E29.262

See application file for complete search history.

(56) References Cited

U.S. PATENT DOCUMENTS

| | | | | |
|---|---|---|---|---|
| 5,184,199 A | * | 2/1993 | Fujii et al. | 257/77 |
| 5,510,630 A | * | 4/1996 | Agarwal et al. | 257/77 |
| 5,900,648 A | * | 5/1999 | Harris et al. | 257/77 |
| 6,228,720 B1 | * | 5/2001 | Kitabatake et al. | 438/268 |
| 6,246,076 B1 | * | 6/2001 | Lipkin et al. | 257/77 |
| 6,528,373 B2 | * | 3/2003 | Lipkin et al. | 438/287 |
| 7,061,027 B2 | * | 6/2006 | Tanaka et al. | 257/192 |
| 7,173,307 B2 | * | 2/2007 | Hayashi et al. | 257/330 |
| 7,256,432 B2 | * | 8/2007 | Okamoto et al. | 257/192 |
| 7,282,739 B2 | * | 10/2007 | Kaneko | 257/77 |
| 7,485,895 B2 | * | 2/2009 | Kaneko | 257/77 |
| 7,588,961 B2 | * | 9/2009 | Shimoida et al. | 438/105 |
| 7,605,017 B2 | * | 10/2009 | Hayashi et al. | 438/81 |
| 7,659,573 B2 | * | 2/2010 | Kim et al. | 257/330 |
| 2004/0217358 A1 | * | 11/2004 | Kaneko | 257/77 |
| 2005/0062048 A1 | * | 3/2005 | Hayashi et al. | 257/77 |
| 2005/0199882 A1 | * | 9/2005 | Sankin et al. | 257/77 |

(Continued)

FOREIGN PATENT DOCUMENTS

JP    2003-318398 A    11/2003

(Continued)

*Primary Examiner* — Mary Wilczewski
(74) *Attorney, Agent, or Firm* — Young Basile

(57) ABSTRACT

Methods of manufacturing a semiconductor device including a semiconductor substrate and a hetero semiconductor region including a semiconductor material having a band gap different from that of the semiconductor substrate and contacting a portion of a first surface of the semiconductor substrate are taught herein, as are the resulting devices. The method comprises depositing a first insulating film on exposed portions of the first surface of the semiconductor substrate and on exposed surfaces of the hetero semiconductor material and forming a second insulating film between the first insulating film and facing surfaces of the semiconductor substrate and the hetero semiconductor region by performing a thermal treatment in an oxidizing atmosphere.

20 Claims, 4 Drawing Sheets

U.S. PATENT DOCUMENTS

2006/0027833 A1* 2/2006 Tanimoto ................ 257/173
2006/0060917 A1* 3/2006 Hayashi et al. ............ 257/330
2006/0223274 A1* 10/2006 Shimoida et al. .......... 438/312
2007/0221955 A1* 9/2007 Shimoida et al. .......... 257/194
2007/0262324 A1* 11/2007 Kaneko ..................... 257/77

FOREIGN PATENT DOCUMENTS

JP        2004-146429 A    5/2004

* cited by examiner

FIG. 1
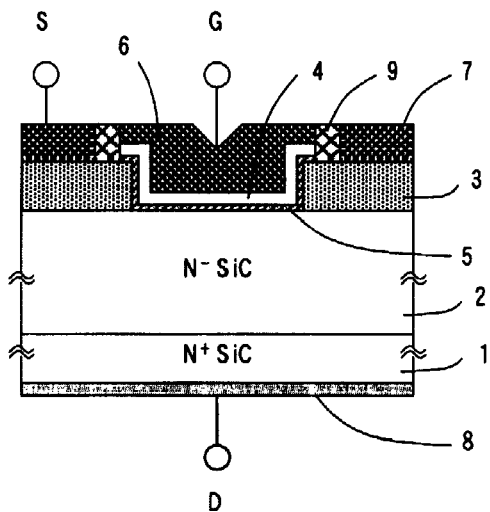
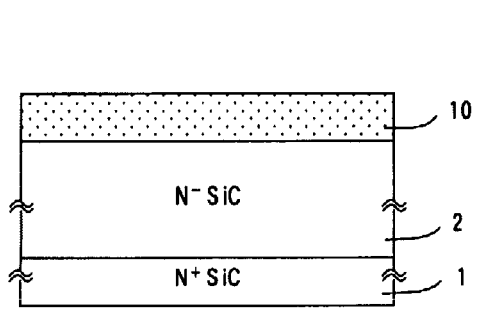
FIG. 2A
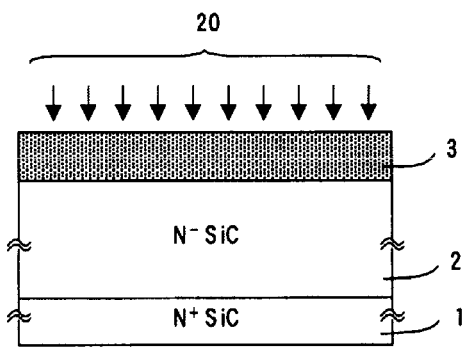
FIG. 2B
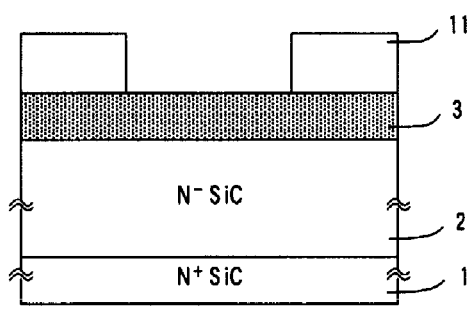
FIG. 2C
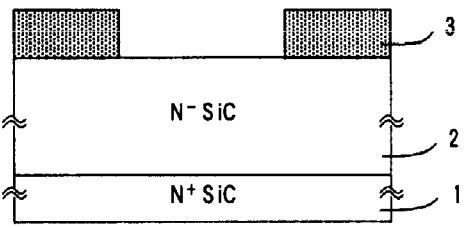
FIG. 2D

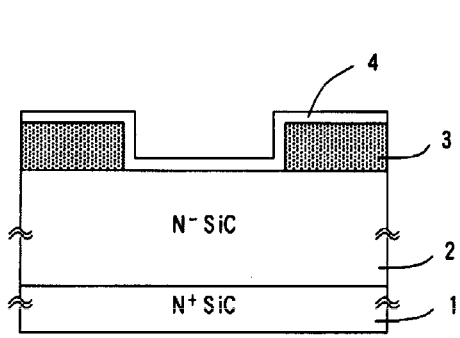
FIG. 2E
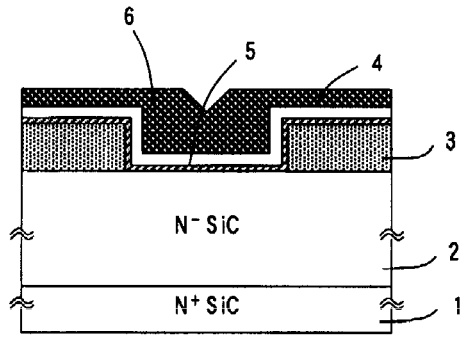
FIG. 2G
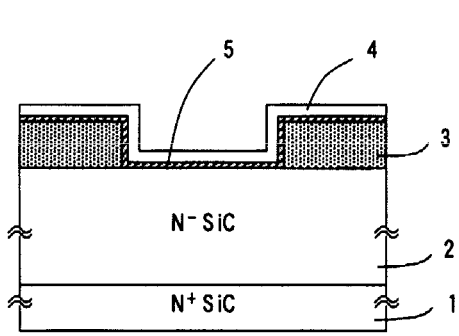
FIG. 2F
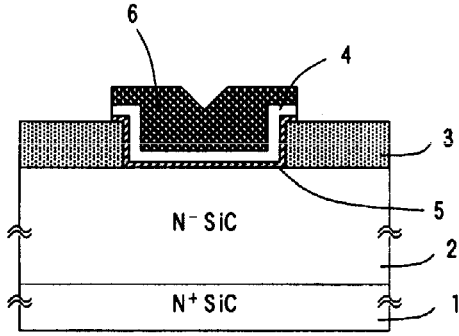
FIG. 2H
FIG. 3
[Oxidization rate changes of the silicon]
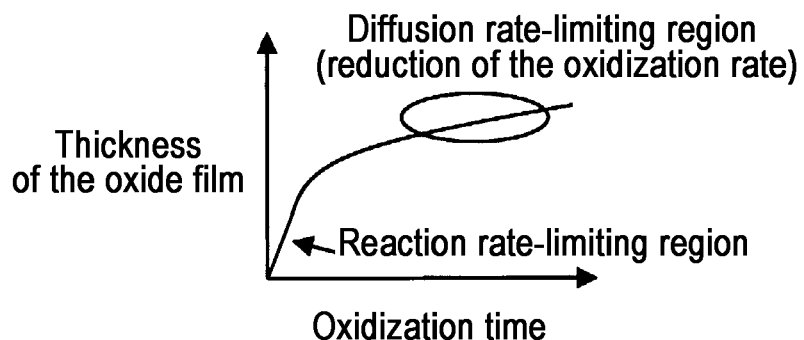

METHOD OF MANUFACTURING SEMICONDUCTOR DEVICE AND SEMICONDUCTOR DEVICE MANUFACTURED THEREOF

CROSS REFERENCE RELATED TO APPLICATIONS

This application claims priority to Japanese Patent Application Serial Nos. 2007-153006, filed Jun. 8, 2007, and 2007-333626, filed Dec. 26, 2007, each of which is incorporated herein in its entirety by reference.

TECHNICAL FIELD

The present invention relates to a method of manufacturing a semiconductor device used for a field effect transistor.

BACKGROUND

Japanese Laid-Open Patent Publication No. 2003-318398 discloses a semiconductor device. In such a device, an $N^-$-type polycrystal silicon region and an $N^+$-type polycrystal silicon region are formed and adjoined to a main surface of a semiconductor substrate, in which an $N^-$-type silicon carbide epitaxial region is formed on an $N^+$-type silicon carbide substrate. The $N^-$-type silicon carbide epitaxial region, the $N^-$-type polycrystal silicon region and the $N^+$-type polycrystal silicon region form a heterojunction. Further, a gate electrode is formed adjacent to a junction portion of the $N^-$-type silicon carbide epitaxial region and the $N^+$-type polycrystal silicon region via a gate insulation film. The $N^-$-type polycrystal silicon region is connected to a source electrode and a drain electrode is formed on another surface of the $N^+$-type silicon carbide substrate.

BRIEF SUMMARY

Embodiments of a method of manufacturing a semiconductor device and the resulting semiconductor devices are taught herein. The semiconductor devices include a semiconductor substrate and a hetero semiconductor region including a semiconductor material having a band gap different from that of the semiconductor substrate and contacting a portion of a first surface of the semiconductor substrate. One method taught herein comprises depositing a first insulating film on exposed portions of the first surface of the semiconductor substrate and on exposed surfaces of the hetero semiconductor material and forming a second insulating film between the first insulating film and facing surfaces of the semiconductor substrate and the hetero semiconductor region by performing a thermal treatment in an oxidizing atmosphere.

BRIEF DESCRIPTION OF THE DRAWINGS

The description herein makes reference to the accompanying drawings wherein like reference numerals refer to like parts throughout the several views, and wherein:

FIG. 1 is a cross-sectional view of a semiconductor device manufactured by a method according to embodiments of the invention;

FIGS. 2A to 2H are diagrams illustrating the method of manufacturing the semiconductor device in accordance with a first embodiment;

FIG. 3 is a schematic view of oxidization rate changes of silicon; and

DETAILED DESCRIPTION OF EMBODIMENTS OF THE INVENTION

Figure 4A:
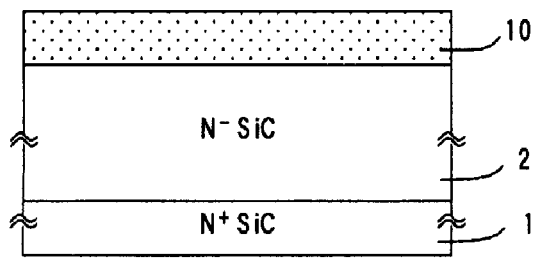
FIGS. 4A to 4G are diagrams illustrating a method of manufacturing a semiconductor device in accordance with a second embodiment of the invention.

In a conventional method of manufacturing the semiconductor device previous described, Japanese Laid-Open Patent Publication No. 2003-318398 discloses a semiconductor device manufactured by using the polycrystal silicon as a hetero semiconductor region and the gate insulating film is formed by depositing a chemical vapor deposition (CVD) oxide film on a polycrystal silicon layer. Further, the polycrystal silicon layer is deposited on the gate insulating film once again. Nonetheless, the interface characteristic is deteriorated since there are a plentitude of defective crystals in a grain boundary between crystal grains in a junction interface of the gate insulating film formed by a deposition method and the silicon carbide epitaxial layer (i.e., the interface state density is increased).

In contrast, methods of manufacturing a semiconductor device according to certain embodiments are taught below.

As shown in FIG. 1, the semiconductor device manufactured by the method according to one embodiment is configured to arrange two unit cells of a field effect transistor so that they face each other. A single field effect transistor is formed by arranging and connecting a plurality of unit cells in parallel. As shown in FIG. 1, the semiconductor device comprises a silicon carbide substrate as a base material, wherein silicon carbide is a semiconductor material. The semiconductor substrate according to the present embodiment is formed from an $N^+$-type silicon carbide substrate 1 in N-type high concentration ($N^+$-type) and an $N^-$-type silicon carbide epitaxial layer 2 in N-type low concentration ($N^-$-type). The $N^-$-type silicon carbide epitaxial layer 2 is formed on a main surface of the $N^+$-type silicon carbide substrate 1. Although there are several polycrystal types of the silicon carbide, the silicon carbide having a representative 4H polycrystal type is used in this embodiment.

The $N^+$-type silicon carbide substrate 1 has a thickness ranging from tens of μm to hundreds of μm. The $N^-$-type silicon carbide epitaxial layer 2 has a thickness ranging from several μm to tens of μm. A semiconductor device of this embodiment also comprises an $N^+$-type polycrystal silicon 3. The $N^+$-type polycrystal silicon 3 is a semiconductor that contacts a surface of the $N^-$-type silicon carbide epitaxial layer 2 opposite from the surface of the $N^-$-type silicon carbide epitaxial layer 2 contacting the $N^+$-type silicon carbide substrate 1. As explained below, the $N^+$-type polycrystal silicon 3 is formed by adopting a polycrystal silicon 10 (see FIG. 2), which is a semiconductor having a band gap different from the silicon carbide, as a base material and introducing N-type impurities 20 (see FIG. 2) to thereby create a hetero semiconductor region. As a result, the $N^-$-type silicon carbide epitaxial layer 2 and the $N^+$-type polycrystal silicon 3 form a heterojunction. A groove extending to the $N^-$-type silicon carbide epitaxial layer 2 is then formed in the $N^+$-type polycrystal silicon 3.

The insulating film and the gate electrode 6 are formed in such a groove. The insulating film is formed of a gate insulating film (thermal oxide film) 5 and a gate insulating film (depositing film) 4. Specifically, the gate insulating film 5 contacts a surface of the $N^-$-type silicon carbide epitaxial layer 2, a side surface of the $N^+$-type polycrystal silicon 3 and a part of the heterojunction portion. Further, the gate insulating film 5 contacts a surface of the $N^+$-type polycrystal silicon 3, i.e., a part of a surface facing the $N^-$-type silicon carbide epitaxial layer 2. The depositing film 4 is formed on a surface of the thermal oxide film 5 that is opposite from the surface of the thermal oxide film 5 facing the $N^-$-type silicon carbide epitaxial layer 2. The gate electrode 6 is formed on a surface of the depositing film 4 that is opposite from the surface of the depositing film 4 facing the thermal oxide film 5. Thus, the gate electrode 6 contacts a part of the heterojunction portion via the depositing film 4 and the thermal oxide film 5.

A source electrode 7 is connected to a surface of the $N^+$-type polycrystal silicon 3. To insulate the source electrode 7 and the gate electrode 6, an interlayer insulating film 9 is formed between the source electrode 7 and the gate electrode 6. A drain electrode 8 is then formed on the surface of the $N^+$-type silicon carbide substrate 1 that is opposite from the surface of the $N^+$-type silicon carbide substrate 1 facing the $N^-$-type silicon carbide epitaxial layer 2. The drain electrode 8 is electrically ohmic-connected to the $N^+$-type silicon carbide substrate 1 at a low resistance. In addition, a termination structure (not shown) such as a guard ring, etc., is adopted at an outermost peripheral portion of a chip of the field effect transistor, in which a plurality of the semiconductor devices made with a method taught herein is connected in parallel. Due to such a termination structure, when the field effect transistor is off, a field concentration therearound is alleviated, thereby accomplishing a high pressure resistance. Since such a field effect transistor may adopt a general termination structure used in a power device field, explanations of the termination structure are omitted herein.

The semiconductor device shown in FIG. 1 serves as a switch by controlling an electric potential of the gate electrode 6 when the source electrode 7 is grounded and a predetermined positive electrical potential is applied to the drain electrode 8. That is, when the gate electrode 6 is grounded, since a reverse bias is applied to a heterojunction portion of the $N^+$-type polycrystal silicon 3 and the $N^-$-type silicon carbide epitaxial layer 2, the current does not flow between the drain electrode 8 and the source electrode 7. However, when a predetermined positive voltage is applied to the gate electrode 6, a gate electrical field affects the heterojunction surface of the $N^+$-type polycrystal silicon 3 and the $N^-$-type silicon carbide epitaxial layer 2. Thus, since a thickness of an energy barrier formed by the heterojunction surface becomes thinner, the current flows between the drain electrode 8 and the source electrode 7. Since the heterojunction portion is used as a control channel for blocking and conducting the current, a length of the channel depends on a thickness of a hetero barrier. Consequently, a low resistance conduction characteristic is obtained.

FIGS. 2A to 2H show a method of manufacturing the semiconductor device according to the first embodiment. First, as shown in FIG. 2A, the $N^-$-type silicon carbide epitaxial layer 2 having an impurity concentration generally ranging from about $10^{14}$ to about $10^{18}$ cm$^{-3}$ and a thickness ranging from several μm to tens of μm is formed on the surface of the $N^+$-type silicon carbide substrate 1. Then, the polycrystal silicon 10 is deposited on the exposed surface of the $N^-$-type silicon carbide epitaxial layer 2. The deposition method may include a low pressure CVD process. Next, as shown in FIG. 2B, the $N^+$-type polycrystal silicon 3 is prepared by introducing the N-type impurities 20 into the polycrystal silicon 10. According to this embodiment, the method of introducing the N-type impurities 20 may include a method of thermally diffusing the N-type impurities 20 after depositing the polycrystal silicon 10.

However, a method of introducing the N-type impurities 20 during the deposition of the polycrystal silicon 10 or ion-injecting the N-type impurities 20 after depositing the polycrystal silicon 10 may alternatively be used.

Next, as shown in FIG. 2C, a resist mask 11 is formed by applying a resist on the surface of the $N^+$-type polycrystal silicon 3 and patterning by photolithography. Then, as shown in FIG. 2D, the $N^+$-type polycrystal silicon 3 is etched by adopting the resist mask 11 as a mask to expose a portion of the $N^{31}$-type silicon carbide epitaxial layer 2. Thereafter, the resist mask 11 is removed. The etching method may include dry etching. Then, in the process shown in FIG. 2E, the depositing film 4 is, for example, deposited for about 1000 Å to thereby contact the $N^-$-type silicon carbide epitaxial layer 2 and the $N^+$-type polycrystal silicon 3 (polycrystal silicon 10). As for the depositing film 4, a silicon oxide film can be appropriately used. Further, the deposition method may include a thermal CVD method, a plasma CVD method or a sputter method.

In the process shown in FIG. 2F, after the depositing film 4 is deposited, a thermal treatment is performed in an oxidizing atmosphere. The oxidizing atmosphere may include atmospheres used in each of a wet oxidization, a dry oxidization and a pyrogenic oxidization, etc. The temperature of the thermal treatment may be, for example, about 1100° C. By the process shown in FIG. 2F, oxygen diffused in the previously deposited depositing film 4 arrives at the interface of the $N^-$-type silicon carbide epitaxial layer 2 and the depositing film 4, thereby oxidizing the $N^-$-type silicon carbide epitaxial layer 2 for several Å to tens of Å. Simultaneously, the surface and side surface of the $N^+$-type polycrystal silicon 3 are oxidized. Thus, the thermal oxide film 5 is formed. Due to the thermal oxide film 5 formed in the above oxidization process, it is possible to reduce the interface state density.

If the depositing film 4 were deposited after the $N^-$-type silicon carbide epitaxial layer 2 is oxidized for several Å to tens of Å, an exposed portion of the $N^-$-type silicon carbide epitaxial layer 2 may be exposed to an outer space between an oxidization process and a deposition process. As a result, there is a concern that such an exposed portion may be contaminated by the impurities from the outer space. However, in the first embodiment, the interface of the $N^-$-type silicon carbide epitaxial layer 2 and the depositing film 4 is oxidized when the exposed portion of the $N^-$-type silicon carbide epitaxial layer 2 is protected, for example, by the depositing film 4 of about 1000 Å. As such, when the thermal oxide film 5 is formed, the exposed portion of the $N^-$-type silicon carbide epitaxial layer 2 is not exposed to the outer space. Consequently, the impurity contamination from the outer field can be prevented. Thus, it is possible to effectively reduce the interface state.

Next, in the process shown in FIG. 2G, the gate electrode 6 is deposited on the surface of the depositing film 4. The gate electrode 6 may include, for example, a polycrystal silicon containing impurities introduced. Then, in the process shown in FIG. 2H, a resist mask (not shown) is formed by applying a resist on the surface of the gate electrode 6, i.e., a surface opposing the depositing film 4, and patterning by photolithography. The gate electrode 6, the depositing film 4 and the thermal oxide film 5 are patterned by adopting the resist mask (not shown) as a mask. Thereafter, the interlayer insulating film 9 is formed, and a contact hole is opened. Finally, the source electrode 7 and the drain electrode 8 are formed to thereby accomplish the semiconductor device shown in FIG. 1.

A restraint of the oxide film thickness of the $N^+$-type polycrystal silicon 3 is explained with reference to FIG. 3 according to one of the embodiments. As shown in FIG. 3, the thickness of the oxide film increases proportional to an oxidization time directly after the oxidization of the silicon is started. However, it is generally known that if the thickness of the oxide film exceeds a certain degree, the oxidization speed is gradually reduced since a diffusion of oxidized species is restrained by the previously existing oxide film. A region wherein the thickness of the oxide film increases proportional to the oxidization time is referred to as a reaction rate-limiting region. Further, a region wherein the oxidization speed is gradually reduced is referred to as a diffusion rate-limiting region. In the first embodiment, after the depositing film 4 is deposited for about 1000 Å to be in contact with the $N^+$-type polycrystal silicon 3, the thermal treatment is started in the oxidizing atmosphere. As such, compared to a case where the depositing film 4 is not deposited on the $N^+$-type polycrystal silicon 3, it is possible to reduce the oxidization speed of the $N^+$-type polycrystal silicon 3. Specifically, it is possible to suppress the thermal oxide film 5 for at least equal to or less than hundreds of Å on the $N^+$-type polycrystal silicon 3. As a result, while restraining the thermal oxide film 5 on the $N^+$-type polycrystal silicon 3 from becoming greatly thicker, the thin thermal oxide film 5 is formed on the interface of the $N^-$-type silicon carbide epitaxial layer 2 and the depositing film 4.

In the method of manufacturing the semiconductor device according to the first embodiment, the $N^+$-type silicon carbide substrate 1 having the silicon carbide as the base material is formed, and the $N^-$-type silicon carbide epitaxial layer 2 is formed on the surface of the $N^+$-type silicon carbide substrate 1. By contacting the surface of the $N^-$-type silicon carbide epitaxial layer 2, the $N^+$-type polycrystal silicon 3 is formed. The $N^+$-type polycrystal silicon 3 has the polycrystal silicon 10 having a band gap different from the silicon carbide as the base material. Further, the depositing film 4 is deposited to thereby contact a part of the heterojunction portion of the $N^-$-type silicon carbide epitaxial layer 2 and the $N^+$-type polycrystal silicon 3. After the deposition, the insulating film is formed by performing a thermal treating in the oxidizing atmosphere and oxidizing the $N^-$-type silicon carbide epitaxial layer 2 and the $N^+$-type polycrystal silicon 3. As a result, since it is possible to reduce the oxidization speed of the $N^+$-type polycrystal silicon 3, it is possible to make the oxidization speed of the $N^+$-type polycrystal silicon 3 close to the oxidization speed of the silicon carbide. That is, even when the $N^-$-type silicon carbide epitaxial layer 2 and the $N^+$-type polycrystal silicon 3 are oxidized at the same time, it is possible to make the thickness of the thermal oxide film 5 formed of the $N^+$-type polycrystal silicon 3 close to the thickness of the thermal oxide film 5 formed of the $N^-$-type silicon carbide epitaxial layer 2. Therefore, it is possible to make the thickness of the thermal oxide film 5 relatively uniform. Further, since the thermal oxide film 5 is formed, it is possible to reduce the interface state density, etc., compared to a case where only the depositing film 4 is formed. Consequently, it is possible to improve the interface characteristic with the $N^-$-type silicon carbide epitaxial layer 2. Thus, it is possible to manufacture the semiconductor device with high reliability and current driving force.

Next, a method of manufacturing a semiconductor device in accordance with a second embodiment is explained with reference to FIGS. 4A to 4G. Herein, the same structures as in the first embodiment are denoted by the same reference numerals. Thus, the explanations thereof are not repeated. Here, the semiconductor device manufactured by the method according to the second embodiment is the same as that of the first embodiment shown in FIG. 1. The method of the second embodiment differs from that of the first embodiment in that the process of introducing the impurities into the polycrystal silicon 10 is performed after the process of forming the thermal oxide film 5. As a result, the same effects of the first embodiment can be obtained.

Figure 4C:
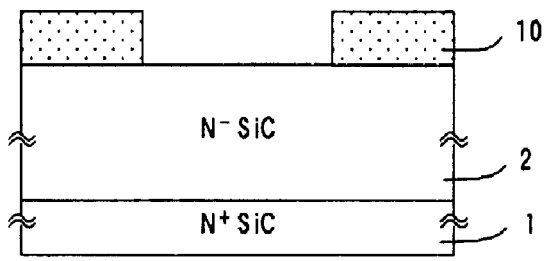
Figure 4B:
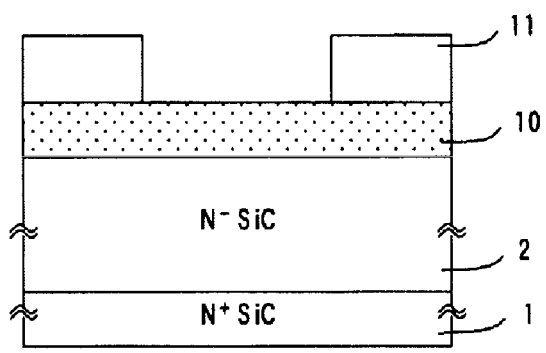

Here, the process shown in FIG. 4A is the same as that shown in FIG. 2A. Next, as shown in FIG. 4B, the resist mask 11 is formed by applying a resist on the surface of the polycrystal silicon 10, i.e., a surface opposing the $N^-$-type silicon carbide epitaxial layer 2, and patterning via photolithography. Then, as shown in FIG. 4C, the polycrystal silicon 10 is etched by adopting the resist mask 11 as a mask to expose the $N^-$-type silicon carbide epitaxial layer 2. Thereafter, the resist mask 11 is removed. The etching method may include dry etching.

Figure 4D:
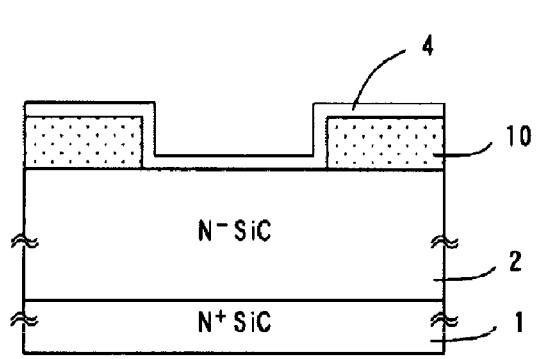
Figure 4F:
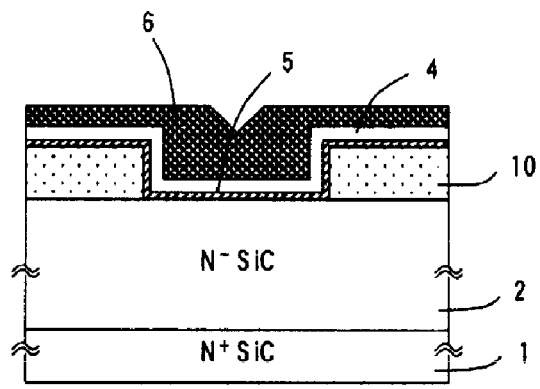
Figure 4E:
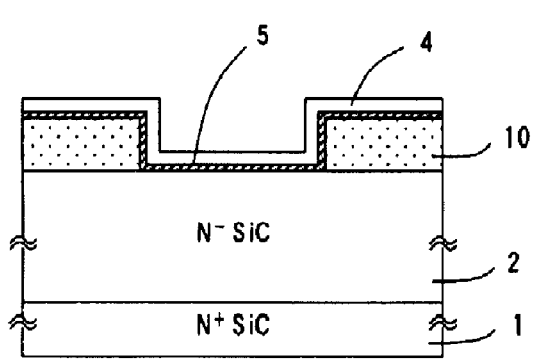

Next, as shown in FIG. 4D, the depositing film 4 is, for example, deposited for about 1000 Å to be in contact with the $N^-$-type silicon carbide epitaxial layer 2 and the polycrystal silicon 10. As for the depositing film 4, a silicon oxide film can be appropriately used. Further, the deposition method may include a thermal CVD method, a plasma CVD method or a sputter method. Then, as shown in FIG. 4E, after the depositing film 4 is deposited, a thermal treatment is performed in an oxidizing atmosphere. The oxidizing atmosphere may include atmospheres used in each of a wet oxidization, a dry oxidization and a pyrogenic oxidization, etc. The temperature of the thermal treatment may be, for example, about 1100° C. By the process shown in FIG. 4E, oxygen diffused in the previously deposited depositing film 4 arrives at the interface of the $N^-$-type silicon carbide epitaxial layer 2 and the depositing film 4, thereby oxidizing the $N^-$-type silicon carbide epitaxial layer 2 for several Å to tens of Å. Simultaneously, the top and side surfaces of the polycrystal silicon 10 are oxidized. Thus, as in the first embodiment, the thermal oxide film 5 is formed.

Further, oxidization is enhanced when the silicon has the impurity concentration equal to or more than $5 \times 10^{18}$ cm$^{-3}$. In the method of manufacturing the semiconductor device according to the second embodiment, when the thermal process is performed in the oxidizing atmosphere after the deposition of the depositing film 4, the polycrystal silicon 10 is in a state of non-dope. As such, compared to the first embodiment, since the polycrystal silicon 10 is difficult to be oxidized, it is possible to more effectively suppress the thermal oxide film 5 formed of the polycrystal silicon 10 from becoming significantly thicker. Consequently, it is possible to better reduce the oxidization speed of the polycrystal silicon 10. Thus, it becomes possible to make the oxidization speed of the polycrystal silicon 10 close to the oxidization speed of the silicon carbide. As such, it is possible to make the thickness of the thermal oxide film 5 relatively uniform. Then, as shown in FIG. 4F, the gate electrode 6 is deposited on the surface of the depositing film 4. As in the first embodiment, the gate electrode 6 may include the polycrystal silicon containing the impurities introduced.

Figure 4G:
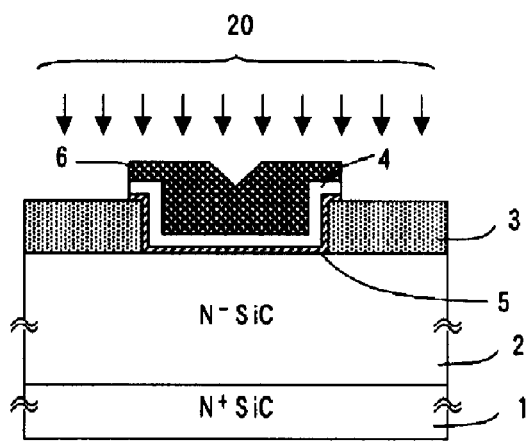

Next, as shown in FIG. 4G, a resist mask (not shown) is formed by applying a resist on the surface of the gate electrode 6 and patterning via photolithography. The gate electrode 6, the depositing film 4 and the thermal oxide film 5 are patterned by adopting the resist mask (not shown) as a mask. Further, after the thermal oxide film 5 is formed, the $N^+$-type polycrystal silicon 3 is formed by introducing the N-type impurities into the polycrystal silicon 10. In the second embodiment, the method of introducing the N-type impurities 20 adopts a method of thermally diffusing the N-type impurities 20 after depositing the polycrystal silicon 10 as in the first embodiment. However, as in the first embodiment, the method of introducing the N-type impurities 20 may include a method of ion-injecting the N-type impurities 20 after depositing the polycrystal silicon 10. Further, after the N-type impurities 20 are introduced and the depositing film 4 is then deposited, an active heating treatment may be performed for the N-type impurities 20 at a temperature lower than a temperature when the thermal treatment is performed in the oxidizing atmosphere. Next, the interlayer insulating film 9 is formed, and a contact hole is opened. Finally, the source electrode 7 and the drain electrode 8 are formed to thereby manufacture the semiconductor device, which has the same structure as the semiconductor device shown in FIG. 1.

In the method of manufacturing the semiconductor device according to the second embodiment, the $N^+$-type silicon carbide substrate 1 having the silicon carbide as the base material is formed, and the $N^-$-type silicon carbide epitaxial layer 2 is formed on the surface of the $N^+$-type silicon carbide substrate 1. Contacting the surface of the $N^-$-type silicon carbide epitaxial layer 2, the polycrystal silicon 10 having the band gap different from the silicon carbide is formed. Also, the depositing film 4 is deposited to be in contact with a part of the heterojunction portion of the $N^-$-type silicon carbide epitaxial layer 2 and the polycrystal silicon 10. After the deposition, the insulating film is formed by performing a thermal treatment in the oxidizing atmosphere and oxidizing the $N^-$-type silicon carbide epitaxial layer 2 and the polycrystal silicon 10. Further, after the insulating film is formed, the $N^+$-type polycrystal silicon 3 is formed by introducing the N-type impurities 20 into the polycrystal silicon 10. As a result, the same effects as in the first embodiment can be obtained.

Further, in the second embodiment, the $N^+$-type polycrystal silicon 3 is formed by introducing the N-type impurities 20 into the polycrystal silicon 10 after the deposition of the depositing film 4, and then the thermal treatment in the oxidizing atmosphere is performed. As such, since the impurities are extracted or excluded from the heterojunction surface of the $N^-$-type silicon carbide epitaxial layer 2 and the $N^+$-type polycrystal silicon 3 during such thermal treatment, it is possible to restrain a distribution of the impurities in the heterojunction surface from being changed.

While certain embodiments of the invention are described above, the invention should not be limited to such embodiments. For example, although the methods of manufacturing the semiconductor device in accordance with the first and second embodiments use silicon carbide having 4H poly type as the semiconductor material, the invention is not specifically limited to such component and may include other poly types. Likewise, although silicon carbide is used as the semiconductor material, the invention is not specifically limited to such component and may include gallium nitride or diamond.

Further, although the methods of manufacturing the semiconductor device in accordance with the first and second embodiments use polycrystal silicon as the hetero semiconductor material, the invention is not limited to such compound and may include silicon germanium, germanium, gallium arsenide, etc. Likewise, the hetero semiconductor material may include monocrystal silicon or amorphous silicon.

Also, although the methods of manufacturing the semiconductor device in accordance with the first and second embodiments use $N^+$-type as the conductive type of the $N^+$-type polycrystal silicon 3, the invention is not limited to such a configuration and may use $N^-$-type, non-dope type, $P^-$-type, etc.

Moreover, although the thickness of the thermal oxide film 5 on the $N^-$-type silicon carbide epitaxial layer 2 ranges from several Å to tens of Å, the invention is not limited thereto and may include any thickness. Likewise, although the thickness of the depositing film 4 is about 1000 Å, the invention is not limited thereto and may include several Å. Further, although a difference between the thickness of the insulating film (that is, the film 5) formed on the $N^+$-type polycrystal silicon 3 and the thickness of the insulating film 5 formed on the $N^-$-type epitaxial layer 2 is hundreds of Å, thus being relatively uniform, the invention is not limited to such configuration. In other words, the thickness of the insulating film 5 formed on the $N^+$-type polycrystal silicon 3 may be up to about two times the thickness of the insulating film 5 formed on the $N^-$-type epitaxial layer 2 and still be considered relatively uniform.

Accordingly, the above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A semiconductor device, comprising:
    a semiconductor substrate having an upper epitaxial layer with a first surface;
    a hetero semiconductor region including a semiconductor material having a band gap different from that of the semiconductor substrate and contacting a first portion of the first surface of the semiconductor substrate; and
    a first insulating film of a silicon oxide on a second portion of the first surface of the semiconductor substrate not contacted by the hetero semiconductor region and on a side surface and upper surface of the hetero semiconductor region; wherein the second portion of the first surface of the semiconductor substrate has an oxidized portion extending from the first surface to a depth less than a thickness of the upper epitaxial layer and the side and upper surfaces of the hetero semiconductor region have an oxidized portion extending from the side and upper surfaces to a depth less than a thickness of the hetero semiconductor region; and wherein the oxidized portions of the semiconductor substrate and the hetero semiconductor region form a second insulating film beneath the first insulating film.

2. The semiconductor device according to claim 1 wherein a thickness of the second insulating film of the hetero semiconductor region is no more than about two times a thickness of the second insulating film of the semiconductor substrate.

3. The semiconductor device according to claim 2, further comprising:
    a gate electrode on an upper surface of the first insulating film opposite the second insulating film;
    a source electrode in electrical contact with the hetero semiconductor region; and
    a drain electrode in ohmic-connection with the semiconductor substrate on a second surface of the semiconductor substrate opposed to the first surface.

4. The semiconductor device according to claim 3, further comprising:
    an interlayer insulating film on a portion of the first surface and separating the first insulating film, the second insulating film and the gate electrode from the source electrode.

5. The semiconductor device according to claim 1, further comprising:
    a gate electrode on an upper surface of the first insulating film opposite the second insulating film;
    a source electrode in electrical contact with the hetero semiconductor region; and a drain electrode in ohmic-connection with the semiconductor substrate on a second surface of the semiconductor substrate opposed to the first surface.

6. The semiconductor device according to claim 5, further comprising:
an interlayer insulating film on a portion of the first surface and separating the first insulating film, the second insulating film and the gate electrode from the source electrode.

7. The semiconductor device according to claim 1 wherein a semiconductor material of the semiconductor substrate comprises at least one of silicon carbide, gallium nitride and diamond.

8. The semiconductor device according to claim 7 wherein the semiconductor material of the hetero semiconductor region comprises at least one of monocrystal silicon, polycrystal silicon, amorphous silicon, germanium, silicon germanium and gallium arsenide.

9. A method of manufacturing a semiconductor device, comprising:
depositing a first insulating film of a silicon oxide on exposed portions of a first surface of a semiconductor substrate and on exposed surfaces of a hetero semiconductor region, the hetero semiconductor region including a semiconductor material having a band gap different from that of the semiconductor substrate and contacting a portion of the first surface of the semiconductor substrate, the first surface of the semiconductor substrate located on an upper epitaxial layer of the semiconductor substrate; and
forming a second insulating film adjacent to the first insulating film by:
forming an oxidized portion of the semiconductor substrate at the exposed portions of the first surface of the semiconductor substrate facing the first insulating film by performing a thermal treatment in an oxidizing atmosphere after depositing the first insulating film, the oxidized portion extending from the first surface to a depth less than a thickness of the upper epitaxial layer of the semiconductor substrate; and
forming an oxidized portion of the hetero semiconductor region at the exposed surfaces of the hetero semiconductor region facing the first insulating film by performing the thermal treatment in the oxidizing atmosphere, the oxidized portion extending from the exposed surfaces to a depth less than a thickness of the hetero semiconductor region; wherein the oxidized portions of the semiconductor substrate and the hetero semiconductor region form the second insulating film beneath the first insulating film; and
wherein the semiconductor device includes:
the semiconductor substrate having the upper epitaxial layer with the first surface;
the hetero semiconductor region including the semiconductor material having the band gap different from that of the semiconductor substrate and contacting a first portion of the first surface of the semiconductor substrate; and
the first insulating film of the silicon oxide on a second portion of the first surface of the semiconductor substrate not contacted by the hetero semiconductor region and on a side surface and upper surface of the hetero semiconductor region; wherein the second portion of the first surface of the semiconductor substrate has the oxidized portion of the semiconductor substrate extending from the first surface to the depth less than a thickness of the upper epitaxial layer and the side and upper surfaces of the hetero semiconductor region have the oxidized portion of the hetero semiconductor region extending from the side and upper surfaces to a depth less than a thickness of the hetero semiconductor region; and wherein the oxidized portions of the semiconductor substrate and the hetero semiconductor region form the second insulating film beneath the first insulating film.

10. The method according to claim 9, further comprising:
forming the hetero semiconductor region on the portion of the first surface of the semiconductor substrate before depositing the first insulating film; and
introducing impurities into the hetero semiconductor region after forming the second insulating film.

11. The method according to claim 10 wherein a thickness of the second insulating film of the hetero semiconductor region is no more than about two times a thickness of the second insulating film of the semiconductor substrate.

12. The method according to claim 10, further comprising:
depositing a gate electrode on an exposed surface of the first insulating film opposite the second insulating film;
forming a source electrode in electrical contact with the hetero semiconductor region; and
forming a drain electrode in ohmic-connection with the semiconductor substrate on a second surface of the semiconductor substrate opposed to the first surface.

13. The method according to claim 9 wherein forming the second insulating film includes performing at least one of a wet oxidization, a dry oxidization and a pyrogenic oxidization.

14. The method according to claim 9 wherein a thickness of the second insulating film of the hetero semiconductor region is no more than about two times a thickness of the second insulating film of the semiconductor substrate.

15. The method according to claim 14, further comprising:
depositing a gate electrode on an exposed surface of the first insulating film opposite the second insulating film;
forming a source electrode in electrical contact with the hetero semiconductor region; and
forming a drain electrode in ohmic-connection with the semiconductor substrate on a second surface of the semiconductor substrate opposed to the first surface.

16. The method according to claim 15, further comprising:
depositing an interlayer insulating film on a portion of the first surface, the interlayer insulating film separating the first insulating film, the second insulating film and the gate electrode from the source electrode.

17. The method according to claim 9, further comprising:
depositing a gate electrode on an exposed surface of the first insulating film opposite the second insulating film;
forming a source electrode in electrical contact with the hetero semiconductor region; and
forming a drain electrode in ohmic-connection with the semiconductor substrate on a second surface of the semiconductor substrate opposed to the first surface.

18. The method according to claim 17, further comprising:
depositing an interlayer insulating film on a portion of the first surface, the interlayer insulating film separating the first insulating film, the second insulating film and the gate electrode from the source electrode.

19. The method according to claim 9 wherein a semiconductor material of the semiconductor substrate comprises at least one of silicon carbide, gallium nitride and diamond.

20. The method according to claim 9 wherein the semiconductor material of the hetero semiconductor region comprises at least one of monocrystal silicon, polycrystal silicon, amorphous silicon, germanium, silicon germanium and gallium arsenide.

* * * * *